(12) United States Patent
Gui

(10) Patent No.: US 7,251,020 B2
(45) Date of Patent: Jul. 31, 2007

(54) LITHOGRAPHIC APPARATUS AND DEVICE MANUFACTURING METHOD

(75) Inventor: Cheng-Qun Gui, Best (NL)

(73) Assignee: ASML Netherlands B.V., Veldhoven (NL)

( * ) Notice: Subject to any disclaimer, the term of this patent is extended or adjusted under 35 U.S.C. 154(b) by 157 days.

(21) Appl. No.: 10/902,697

(22) Filed: Jul. 30, 2004

(65) Prior Publication Data

US 2006/0023192 A1 Feb. 2, 2006

(51) Int. Cl.
*G03B 27/32* (2006.01)
*G03B 27/54* (2006.01)

(52) U.S. Cl. .......................................... 355/67; 355/77
(58) Field of Classification Search ................. 355/67, 355/51, 53, 77
See application file for complete search history.

(56) References Cited

U.S. PATENT DOCUMENTS

| | | | |
|---|---|---|---|
| 4,668,080 A * | 5/1987 | Gale et al. ..................... | 355/51 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,515,257 B1 | 2/2003 | Jain et al. | |
| 6,624,880 B2 | 9/2003 | Sandstrom et al. | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,819,490 B2 * | 11/2004 | Sandstrom et al. ......... | 359/566 |
| 6,967,711 B2 | 11/2005 | Gui | |
| 2003/0084422 A1 * | 5/2003 | Chan .......................... | 716/21 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2006/0055905 A1 | 3/2006 | Baselmans et al. | |

FOREIGN PATENT DOCUMENTS

| | | |
|---|---|---|
| WO | WO 98/33096 | 7/1998 |
| WO | WO 98/38597 | 9/1998 |

* cited by examiner

*Primary Examiner*—Rodney Fuller
(74) *Attorney, Agent, or Firm*—Sterne, Kessler, Goldstein & Fox, PLLC

(57) ABSTRACT

A lithographic apparatus includes an illumination system that supplies a beam of radiation, an array of individually controllable elements that pattern the beam, a substrate table for supporting a substrate, and a projection system that projects the patterned beam onto a target portion of the substrate. The projection system comprises an array of lenses arranged to receive the patterned beam, divide the patterned beam into a plurality of substantially polygonal portions, and focus each substantially polygonal portion to form a respective radiation spot on the target portion of the substrate. In one example, the illumination system comprises an illuminator arranged to receive a beam of radiation from a radiation source, the illuminator comprising an array of lenses arranged to divide the beam of radiation from the source into a plurality of substantially polygonal portions and to focus each substantially polygonal portion onto a respective one of the array of individually controllable elements.

19 Claims, 9 Drawing Sheets

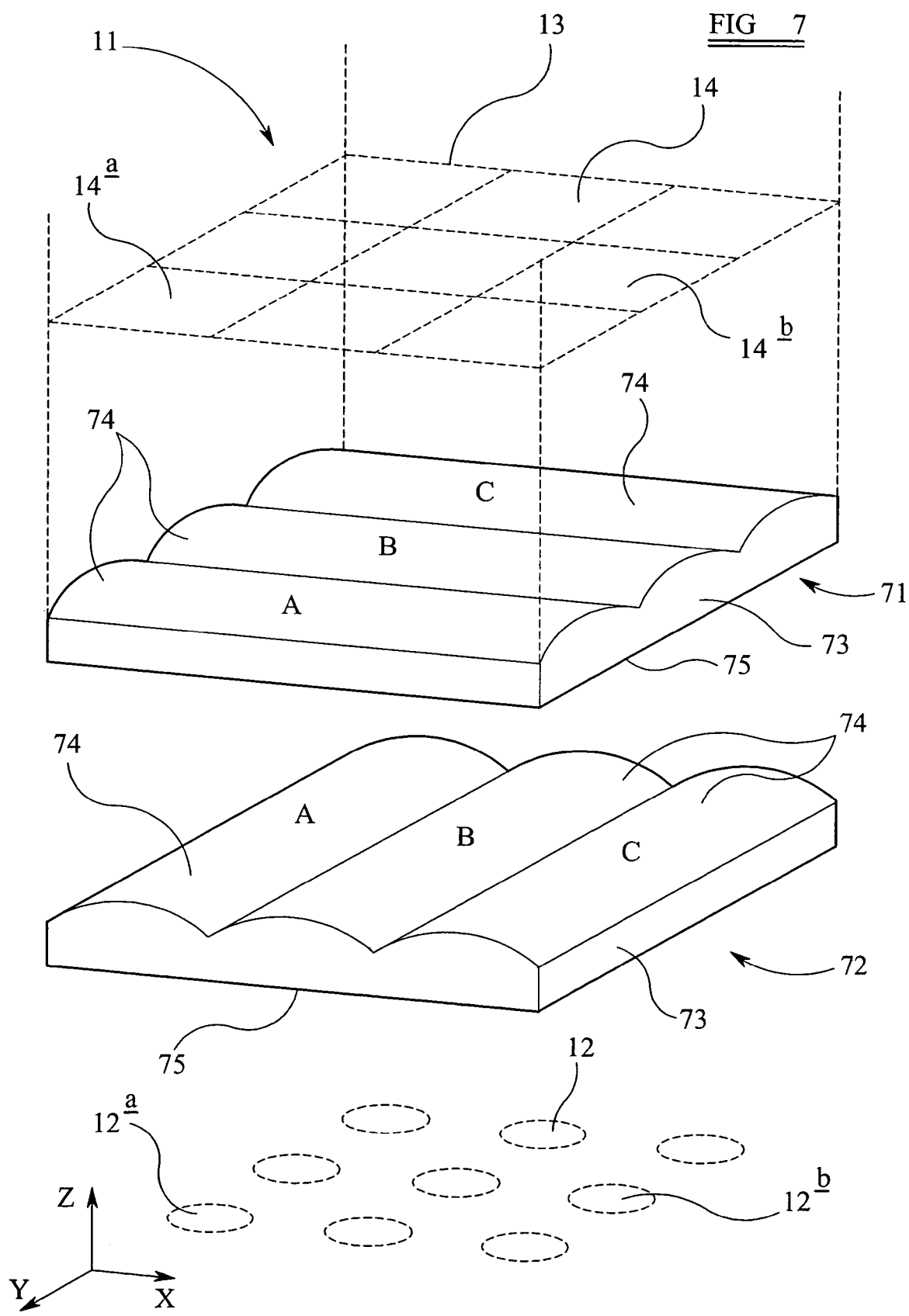

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, print heads, micro or nano-fluidic devices, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation sensitive material (e.g., resist). Instead of a mask, the patterning means may comprise an array of individually controllable elements that generate the circuit pattern.

In general, a single substrate will contain a collection of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In maskless lithography it is known to project the patterned beam onto a target portion of the substrate using a projection system that comprises an array of lenses arranged such that each lens receives and focuses a respective portion of the patterned beam. Each lens of the array of lenses thus projects a respective spot of radiation onto the substrate, and the array of lenses collectively projects a radiation pattern on the substrate. Such systems are generally referred to as microlens array or MLA systems. In these systems, the patterned beam is typically projected onto array of lenses through a beam expander that comprises a series of optical components and is arranged to provide a substantially parallel radiation beam.

It will be appreciated that an inherent disadvantage of using a MLA of the is that a portion of the patterned beam incident on the MLA is lost, i.e., a portion does not reach the target surface of the substrate. This lost portion is the part of the beam which falls between the lenses of the MLA (i.e. the part that falls on a masking structure of the MLA). To reduce the amount of the beam cross section that is blocked (i.e., to maximize the proportion reaching the target substrate) openings or windows in the masking structure of the MLA may be made as large as possible. However, even with the MLA having larger windows, the proportion of the patterned beam cross section being lost (i.e., not reaching the substrate) can still be about 21.5%. With this result, a maximum fill ratio for a rectangular array of circular lenses is 78.5%. In practice, the maximum achievable fill ratio maybe lower than 70%.

Therefore, what is needed is a more efficient MLA.

SUMMARY OF THE INVENTION

According to one embodiment, there is provided a lithographic apparatus comprising an illumination system for supplying a beam of radiation, an array of individually controllable elements serving to impart the beam with a pattern in its cross-section, a substrate table for supporting a substrate, and a projection system for projecting the patterned beam onto a target portion of the substrate. The projection system comprises an array of lenses arranged to receive the patterned beam, divide the patterned beam cross-section into a plurality of substantially polygonal portions, and focus each substantially polygonal portion to form a respective radiation spot on the target portion of the substrate.

In this embodiment, the array of lenses in is arranged to focus polygonal portions of the beam cross section. In one example, a maximum fill ratio of 78.5% inherent when using rectangular arrays of circular lenses is avoided. A greater portion of the patterned beam may be directed onto the target substrate, and this portion may be as high as 100%.

In one example, each substantially polygonal portion is substantially rectangular. In another example, each substantially polygonal portion is substantially square. Dividing the patterned beam cross section into squares is particularly desired when the beam patterning means is in the form of a square grid of controllable elements, as each projected radiation spot may thus correspond to a respective one of the elements.

In one example, the array of lenses comprises a first array of cylindrical lenses, each cylindrical lens being arranged to receive a respective rectangular portion of the patterned beam cross section and to focus that respective portion towards a respective focal line. The focal lines of the cylindrical lenses are substantially parallel to each other and to a first axis. The first axis is transverse to the beam direction. In one example, the focal lines of the cylindrical lenses of the first array are coplanar, and the array itself may be a generally planar structure, with the lenses being provided by parallel portions of a common transparent substrate for example.

In one example, the array of lenses further comprises a second array of cylindrical lenses arranged to receive the focused, patterned beam from the first array, (i.e., the first and second arrays may be arranged in series along the beam). In this example, each cylindrical lens of the second array is arranged to receive a respective rectangular portion of the focused patterned beam cross section and to further focus that respective portion towards a respective focal line. The focal lines of the cylindrical lenses of the second array are substantially parallel to each other and to a second axis. The second axis is transverse to the beam direction and substantially perpendicular to the first axis. Again, the focal lines of the cylindrical lenses of the second array are coplanar, and the second array itself may be a generally planar structure, with the lenses being provided by parallel portions of a common transparent substrate.

Thus, the division of the beam cross section into rectangular portions, and focusing of those portions down to an array of rectangular spots on the target substrate may conveniently be achieved by a series combination of crossed cylindrical lens arrays.

In one example, the cylindrical lenses of the first array have a first common focal length and the cylindrical lenses of the second array have a second common focal length. The first common focal length is longer than the second common focal length. In another example, these first and second arrays with different focal lengths are arranged, such that the focal lines of the lenses of the first array and the focal lines of the lenses of the second array fall on the same common plane. Thus, although the first and second cylindrical lens arrays are different distances from the target plane (e.g., they may be at different heights above the target substrate) because they are arranged in series along the beam direction, they may each focus onto the target plane. In other words, the two lens arrays may have a common focal plane. It will thus be appreciated that the lenses of the first cylindrical lens array may have a different curvature to those of the second.

The first and second arrays of cylindrical lenses may be provided by physically separate structures, but in alternative embodiments they may be provided by respective portions of a common substrate.

In one example, the first array of cylindrical lenses comprises a first transparent substrate. Each cylindrical lens of the first array is provided by a respective portion of the first substrate. The second array of cylindrical lenses comprises a second transparent substrate. Each cylindrical lens of the second array being provided by a respective portion of the second substrate. The second substrate is attached to the first substrate. This attachment may be by means of bonding, for example with a suitable adhesive, or with other bonding techniques, such as eutectic bonding or direct bonding using van der Waals forces.

It will thus be appreciated that one form of lens array suitable for use in embodiments and examples of the invention described above comprises a first parallel array of cylindrical lenses, to extend across the patterned beam in a first direction, arranged in series with a second parallel array of cylindrical lenses, to extend across the patterned beam in a second direction, perpendicular to the first. However, in alternative embodiments the first and second arrays of cylindrical lenses may not be perpendicular to one another.

In one example, array of lenses may comprise no masking structure, and the proportion of the patterned beam reaching the target substrate may be as high as 100%. Alternatively, a masking structure may be employed to block a portion of the patterned beam, for example to reduce "crosstalk" between adjacent projected radiation spots (which may also be referred to as pixels). The masking structure may, for example, take the form of blocking material arranged on a surface of a lens substrate (e.g., a line of material separating adjacent cylindrical lenses on a common substrate), or may be located elsewhere in the projection system. For example, in embodiments in which array of lenses comprises a series arrangement of crossed cylindrical lens arrays, a mask may be arranged between the two arrays.

In one example, the array of lenses is arranged to focus at least 90% of the patterned beam cross section onto the target portion of the substrate, so providing a significant improvement over the conventional MLAs which could deliver a theoretical maximum of only 78.5%.

In one example, the array of individually controllable elements may be a rectangular array. The array of lenses is arranged, such that the projected spots form a rectangular array, each spot corresponding to a respective one of the controllable elements.

Another embodiment provides a lithographic apparatus comprising an illumination system for supplying a beam of radiation, an array of individually controllable elements serving to impart the beam with a pattern in its cross section, a substrate table for supporting a substrate, and a projection system for projecting the patterned beam onto a target portion of the substrate. The illumination system comprises an illuminator arranged to receive a beam of radiation from a radiation source. The illuminator comprising an array of lenses arranged to divide the cross section of the beam of radiation from the source into a plurality of substantially polygonal portions and to focus each substantially polygonal portion onto a respective one of the array of individually controllable elements.

In one example, the proportion of the beam "lost" or wasted in the patterning process is reduced. The array of lenses is able to focus portions of the supplied beam that would otherwise have fallen between the patterning elements, onto the elements.

It will be appreciated that lens arrays as described above in relation to the projection system of the first embodiment of the invention, may be used with corresponding illuminator of this second embodiment.

In this embodiment, a pair of cylindrical lens arrays may be used in the illumination system, close to the contrast device, to generate spot illumination of the elements (which may also be referred to as pixels) of the contrast device.

According to a further embodiment, there is provided a device manufacturing method comprising the steps of providing a substrate, providing a beam of radiation using an illumination system, using an array of individually controllable elements to impart the beam with a pattern in its cross section, and projecting the patterned beam of radiation onto a target portion of the substrate. The step of projecting comprises the steps of dividing the patterned beam cross section into a plurality of substantially polygonal portions and focusing each substantially polygonal portion to form a respective radiation spot on the target portion of the substrate.

Yet another embodiment provides a device manufacturing method comprising the steps of providing a substrate, providing a beam of radiation using an illumination system, using an array of individually controllable elements to impart the beam with a pattern in its cross section, and projecting the patterned beam of radiation onto a target portion of the substrate. The step of providing a beam comprises the steps of providing a beam of radiation from a source, dividing the cross section of the beam of radiation from the source into a plurality of substantially polygonal portions, and focusing each substantially polygonal portion onto a respective one of the array of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 7 is a schematic representation of a lens array and illustrates the focusing action of array of lenses on an incident patterned beam, according to one embodiment of the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Figure 1:
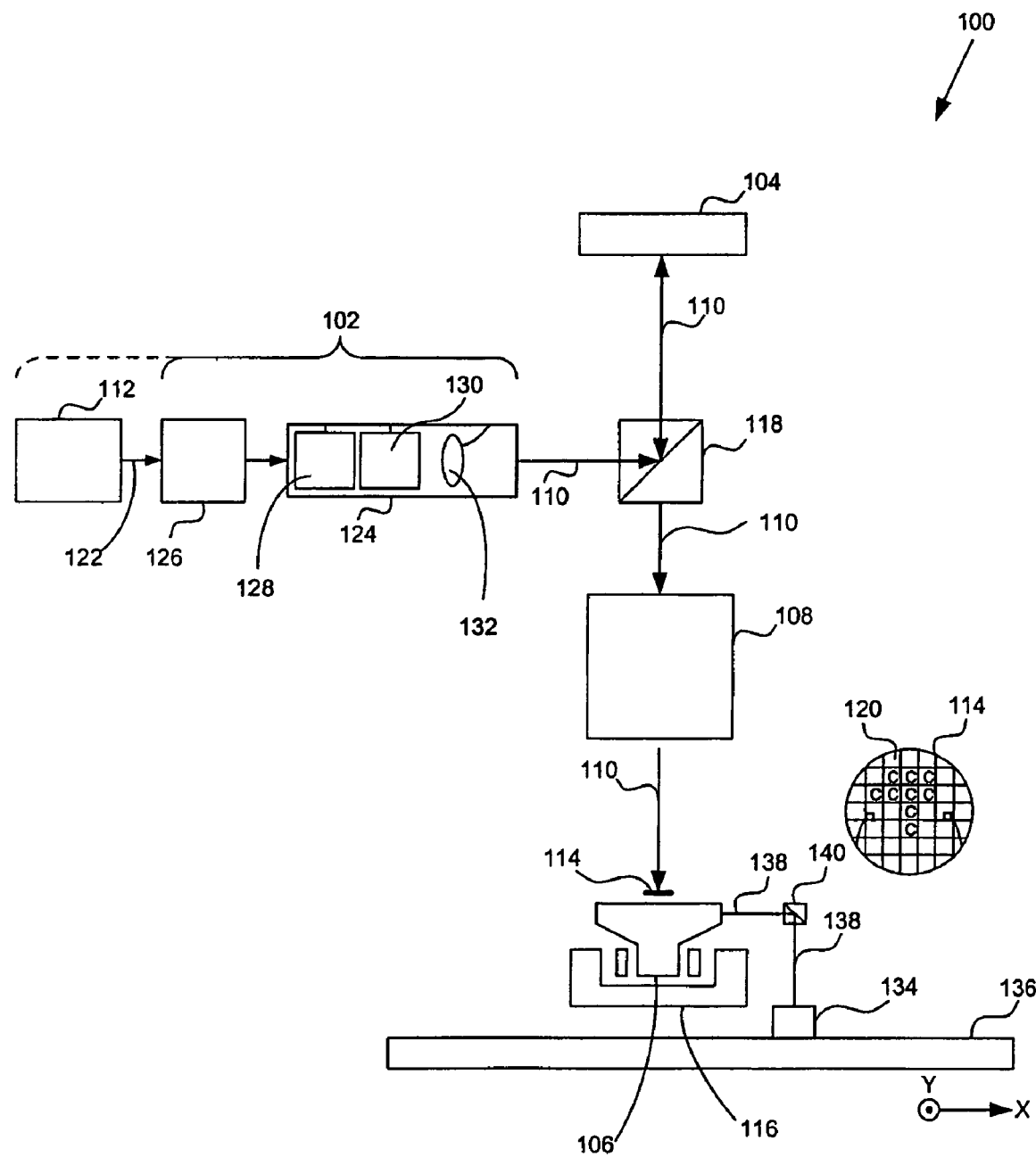
FIG. 1 depicts a lithographic apparatus, according to one embodiment of the invention.

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

It will be appreciated that the term "focus" is to be interpreted in a broad sense, meaning that an array of lenses is arranged to concentrate each polygonal portion to a certain degree, to form the respective radiation spots. In other words, the array of lenses causes rays of each polygonal portion to converge to form the radiation spot. However, each radiation spot is not necessarily a sharp image, although in certain embodiments it may be.

The term "array of individually controllable elements" as here employed should be broadly interpreted as referring to any device that can be used to endow an incoming radiation beam with a patterned cross section, so that a desired pattern can be created in a target portion of the substrate. The terms "light valve" and "Spatial Light Modulator" (SLM) can also be used in this context. Examples of such patterning devices are discussed below.

A programmable mirror array may comprise a matrix addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix addressable surface.

It will be appreciated that, as an alternative, the filter may filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix addressable, such that addressed mirrors will reflect an incoming radiation beam in a different direction to unaddressed mirrors; in this manner, the reflected beam is patterned according to the addressing pattern of the matrix addressable mirrors. The required matrix addressing can be performed using suitable electronic means.

In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where prebiasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multilayer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultraviolet (EUV) radiation (e.g. having a wavelength in the range of 520 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

FIRST EXEMPLARY LITHOGRAPHIC APPARATUS

Figure 2:
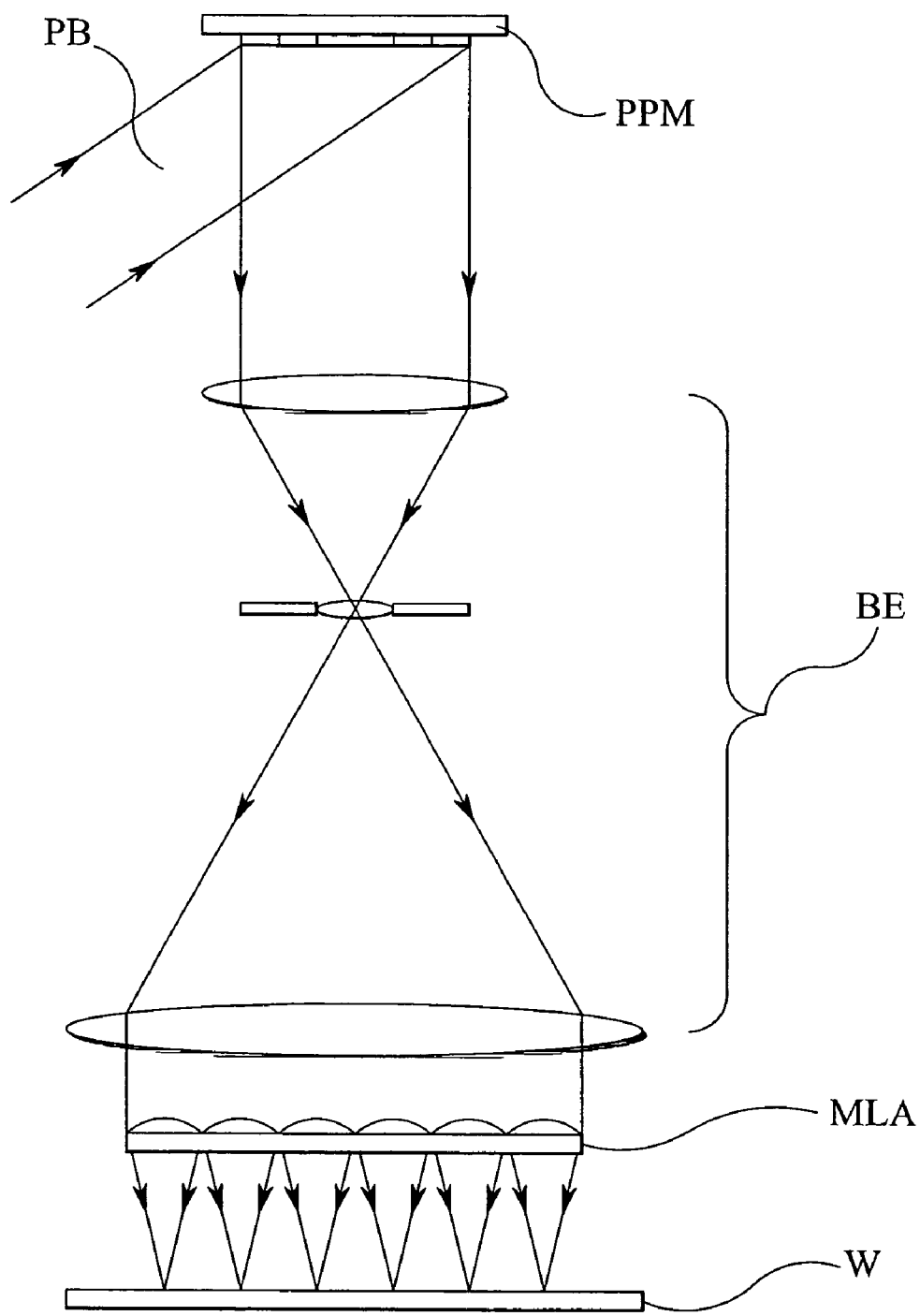
FIG. 2 depicts part of a lithographic apparatus.

FIG. 2 depicts part of a lithographic apparatus. A beam PB from a collimated source, such as a mercury lamp or a laser, is directed onto an array of controllable elements PPM. The patterned beam reflected from the array PPM is projected onto a MLA by a beam expander BE. The MLA projects an array of radiation spots onto a target surface of a substrate W.

Figure 3:
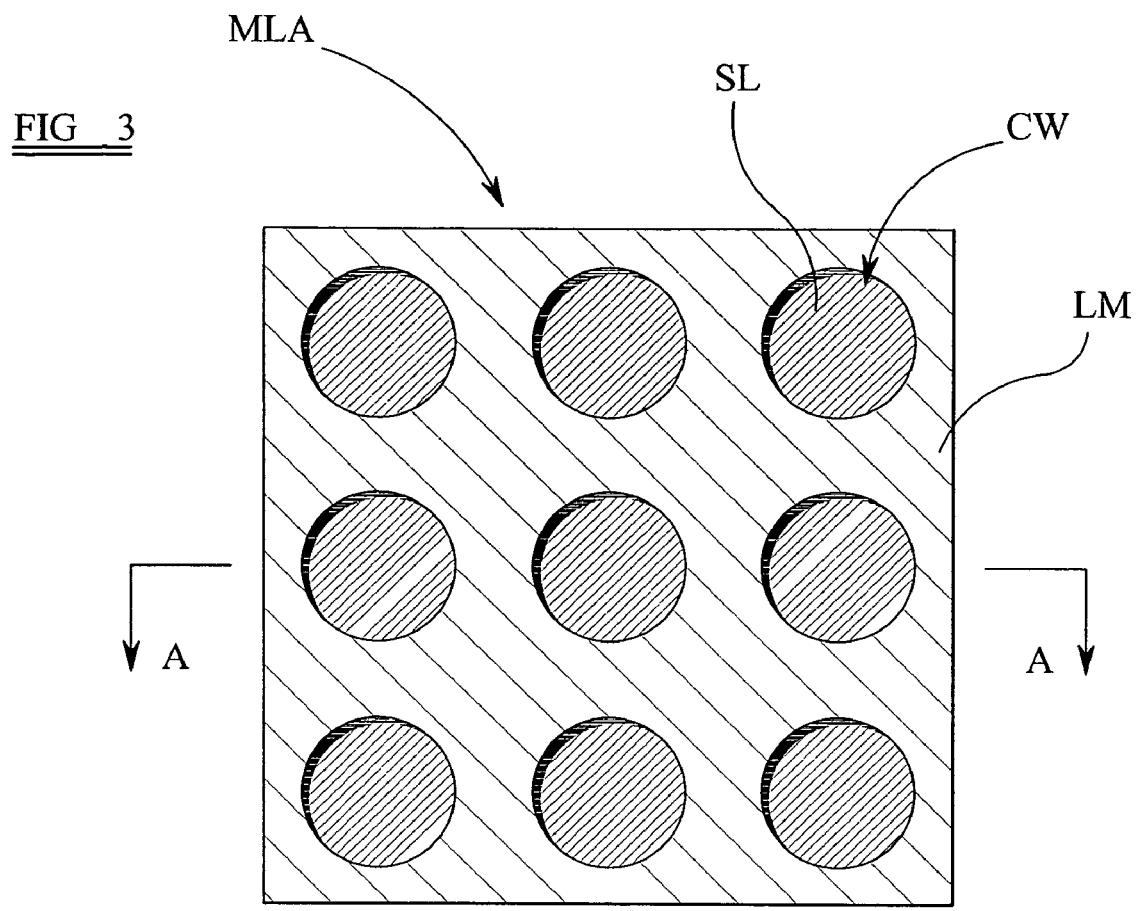
FIG. 3 is a simplified plan view of a micro lens array (MLA).
Figure 4:
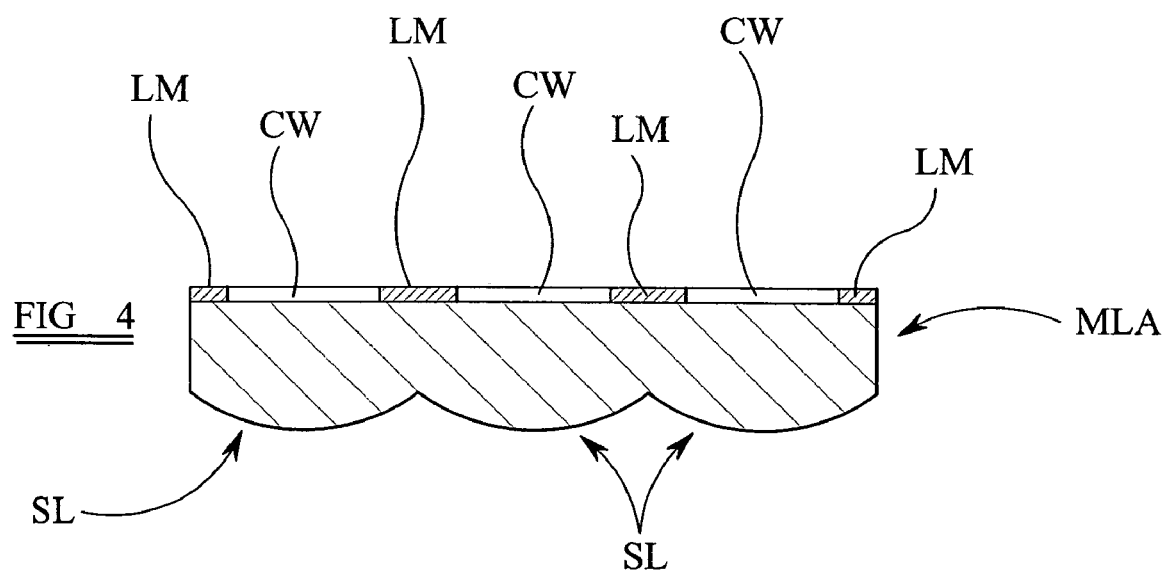
FIG. 4 is a cross section, along line AA of the MLA of FIG. 3.

FIG. 3 is a simplified plan view of a micro lens array (MLA) and FIG. 4 is a cross section, along line AA, of the MLA of FIG. 3. The MLA comprises a body of transparent material having a flat upper surface and a lower surface shaped to define a plurality of spherical lenses SL. The MLA also comprises a mask structure, in the form of a layer LM of opaque material attached to first, flat surface of the transparent body. An array of circular windows CW is formed in the opaque layer LM, each window CW being centered on a respective one of the lens portions SL.

Although FIG. 3 shows an array of just nine windows, it will be appreciated that, in practice, the MLA may comprise as many as one million microlenses, or more.

Figure 5:
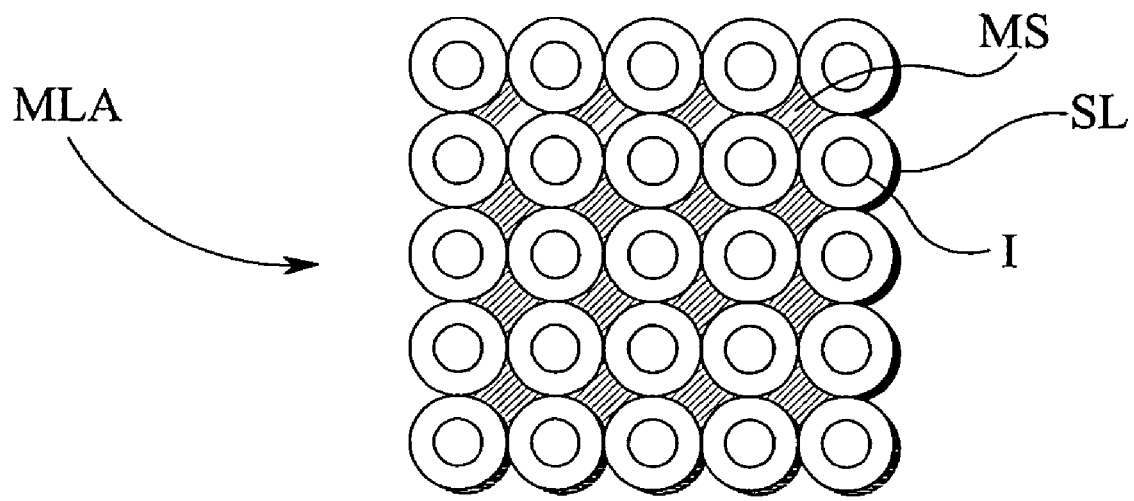
FIG. 5 is a schematic representation of a MLA used in a lithographic apparatus, also showing the corresponding pattern of projected radiation spots.

FIG. 5 is a schematic representation of a MLA used in a lithographic apparatus, also showing the corresponding pattern of projected radiation spots. To reduce the amount of the beam cross section that is blocked (i.e., to maximize the proportion reaching the target substrate) the windows may be made as large as possible. The projected image spots I on the underlying substrate also being shown. These image spots are circular (aerial).

SECOND EXEMPLARY LITHOGRAPHIC APPARATUS

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 may be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or CaF2 lens system or a catadioptric system comprising lens elements made from such materials, or a mirror system) can be used for projecting the patterned beam received from a beam splitter 118 onto a target portion 120 (e.g., one or more dies) of substrate 114. Projection system 108 may project an image of the array of individually controllable elements 104 onto substrate 114. Alternatively, projection system 108 may project images of secondary sources for which the elements of the array of individually controllable elements 104 act as shutters. Projection system 108 may also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander 126, for example. Illuminator 124 may comprise an adjusting device 128 for setting the outer and/or inner radial extent (commonly referred to as σ outer and σ inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 may be within the housing of lithographic projection apparatus 100 (as is often the case when source 112 is a mercury lamp, for example). In alternative embodiments, source 112 may also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directing using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 106 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long stroke module (course positioning) and a short stroke module (fine positioning), which are not explicitly depicted in FIG. 1. A similar system may also be used to position the array of individually controllable elements 104. It will be appreciated that beam 110 may alternatively/additionally be moveable, while object table 106 and/or the array of individually controllable elements 104 may have a fixed position to provide the required relative movement.

In an alternative configuration of the embodiment, substrate table 106 may be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 may be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 maybe used to project a patterned beam 110 for use in resistless lithography.

The depicted apparatus 100 can be used in four preferred modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

Combinations and/or variations on the above described modes of use or entirely different modes of use may also be employed.

THIRD EXEMPLARY LITHOGRAPHIC APPARATUS

Figure 6:
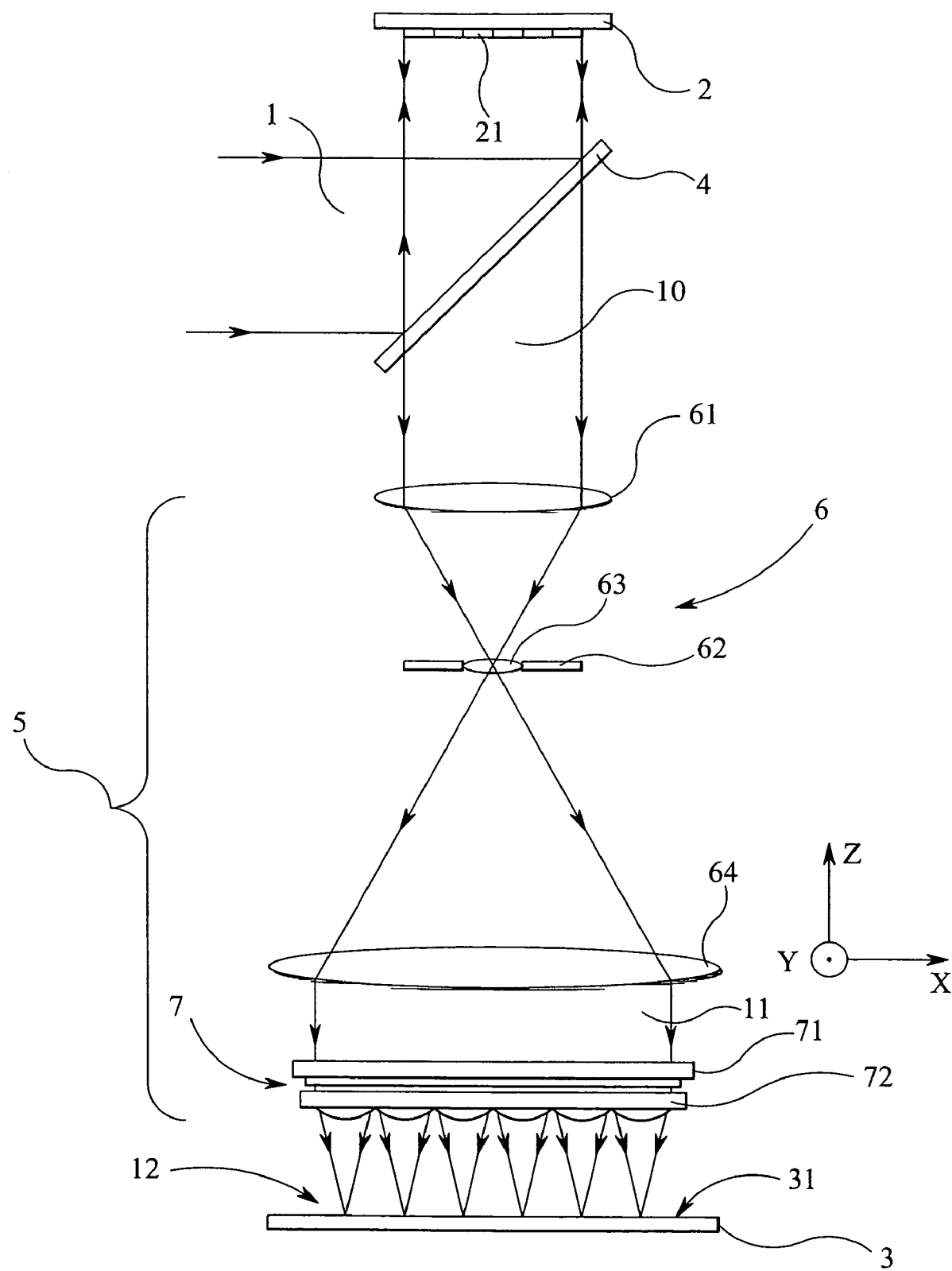
FIG. 6 depicts part of a lithographic apparatus, according to one embodiment of the invention.

FIG. 6 depicts part of a lithographic apparatus, according to one embodiment of the invention. FIG. 6 comprises an illumination system arranged to supply a beam 1 of radiation. Beam 1 is directed by a beam splitter 4 onto an array 2 of controllable elements 21. Control means (not shown) controls states of elements 21, so that a desired pattern can be imparted to beam 1. The patterned beam 10, reflected from array of elements 21, then passes through beam splitter 4 and is projected by a projection system 5 onto a target surface 31 of a substrate 3.

In this embodiment, projection system 5 includes a beam expander, which comprises a first lens 61 arranged to receive the patterned beam 10 and focus it through an aperture in an aperture stop 62. A further lens 63 is located in the aperture. Beam 10 then diverges and is focused by a third lens 64 (e.g., a field lens) to form a substantially parallel, expanded, and patterned beam 11. Projection system 5 further comprises an array of lenses 7 arranged to receive expanded and patterned beam 11. Array of lenses 7 divides expanded and patterned beam 11 cross section into a plurality of substantially polygonal portions, and focuses each substantially polygonal portion to form a respective radiation spot 12 on target surface 31 of substrate 3. Array of lenses 7 divides beam 11 in the sense that each radiation spot 12 on target surface 31 is derived from a respective polygonal portion of beam 11. In one example, array of lenses 7 is arranged to focus square portions of the beam cross section to form corresponding square radiation spots 12 on target surface 31.

Array of lenses 7 comprises a first parallel array of cylindrical lenses 71 in series with a second parallel array of cylindrical lenses 72. An arbitrary set of axes, X, Y & Z, is shown in FIG. 6, and in this example the Z direction is parallel to the beam projection direction.

First array 71 of cylindrical lenses is arranged such that each of its cylindrical lenses focuses a portion of beam 11 towards a focal line, which is parallel to the X axis. The cylindrical lenses of first array 71 can be regarded as extending across the beam direction in a first direction.

Second array 72 of cylindrical lenses comprises lenses of the same size and pitch as those of first array 71, but each cylindrical lens of second array 72 extends in a second direction across the beam, so that it focuses incident radiation towards a focal line that is parallel to the Y axis. First and second arrays 71 and 72 can be regarded as being arranged such that they are generally parallel to target surface 31 of substrate 3, but second array 72 has been rotated 90° about the X axis with respect to first array 71, so that the cylindrical lenses of the two arrays are crossed. It is to be appreciated, the size and pitch of the lenses of the two arrays may not be the same.

The series combination of crossed cylindrical lens arrays has the effect of focusing beam 11 into an array of radiation spots 12. In this example, each radiation spot 12 corresponds to a respective one of controllable elements 21.

In one example, a number N of cylindrical lenses in first array 71 is equal to that in second array 72, and a number of projected radiation spots 12 is equal to N×N. In this example, first array 71 has a longer focal length than does the second array 72, and the focal planes of both arrays 71,72 are arranged to be coplanar, falling on target surface 31.

The distance between first lens array 71 and target substrate 31 is generally referred to as a free working distance, and this should be as large as possible. It will be appreciated that the free working distance is determined by the focal length of second lens array 72.

In one example, first lens array 71 may have a focal length of approximately 1 mm, and second lens array 72 may have a thickness of approximately 200 microns, giving a maximum free working distance of 800 microns if second lens array 72 is as close as possible to first array 71.

In one example, a combined lens array formed from first and second arrays 71,72 may, have a numerical aperture of about 0.15.

It will be appreciated that although the lenses of first and second lens arrays 71, 72 are being described as cylindrical, this does not necessarily mean that their curved surfaces exactly follow circular paths; they may have different curvature. In its broadest sense, a cylindrical lens should be interpreted as any lens which focuses incident parallel light to a focal line.

FIG. 7 is a schematic representation of a lens array and illustrates the focusing action of array of lenses on an incident patterned beam, according to one embodiment of the invention. This Figure shows a focusing action of a lens array suitable for use in embodiments of the invention, such as that illustrated in FIG. 6. Again, array of lenses comprises a first array 71 of cylindrical lenses A, B, C in series with a second array 72 of parallel, cylindrical lenses A, B, C. First array 71 receives beam 11, which may or may not have been previously expanded. Second array 72 then receives the resultant focused patterned beam from first array 71.

It will be appreciated that each of the arrays 71 and 72 is shown to have three cylindrical lenses only for simplicity. There may be in excess of 1,000 microcylindrical lenses in each array.

In one example, first array 71 comprises a substrate (or body) 73 of transparent material and cylindrical lenses A, B, and C are provided by respective portions of substrate 73. A lower surface 75 of substrate 73 is substantially flat and is arranged so as to be parallel with the X Y plane. An upper surface of substrate 73 is shaped to form three cylindrical lenses A, B, and C. Each cylindrical lens comprises a cylindrical surface 74.

In this example, the boundaries between adjacent cylindrical lenses A, B, and/or C run parallel to the X direction and each cylindrical lens portion focuses incident radiation to a focal line, which is also parallel to the X axis. The focal lines of all three lenses of first array 71 are coplanar.

In this example, second array 72 of cylindrical lenses has the same structure as first array 71, but the cylindrical lenses A, B, and C are orientated such that their focal lines are parallel to the Y axis (i.e., perpendicular to the X axis). A patterned beam 11, incident on the series combination of crossed cylindrical lens arrays, is shown. Patterned beam cross section is denoted by reference numerical 13. The combined effect of the two cylindrical arrays on beam 11 is, effectively, to divide its cross section 13 into a plurality (e.g., 9) rectangular portions 14. Each rectangular portion 14 is focused (i.e., concentrated) to form a respective radiation spot 12 on a target plane (not shown), which, can correspond to a position of a target surface of a substrate.

In this example, the array of lenses projects a radiation pattern, which is a rectangular array of circular radiation spots 12. Each radiation spot 12 is the result of the combined focusing action of a respective cylindrical lens in first array 71 and a respective cylindrical lens in second array 72. A rectangular portion 14a of beam cross section 13 is focused by lens A of first array 71 and then by lens A of second array 72 to form radiation spot 12a. Similarly, a rectangular portion 14b is focused by lens B of first array and lens C of second array to form spot 12b.

In one example, the two cylindrical lens arrays 71, 72 can be regarded as being assembled to form a 2D lens array. The image of this 2D lens array is projected onto the target substrate.

In one example, the two cylindrical lens arrays 71 and 72 have a same pitch. For example, the pitch between the cylindrical lenses may be between approximately 0.05 and approximately 1.5 mm. The numerical aperture (NA) of the 2D lens array may, for example, be between approximately 0.05 and approximately 0.3 depending on the imagining resolution requirements.

In this embodiment, lens arrays 71 and 72 comprise no masking structure, and an aperture opening of each cylindrical lens array 71 and 72 is as large as the pitch. Theoretically, therefore, 100% of the beam cross section 13 is focused onto the target substrate.

In this embodiment, lens arrays 71,72 are formed from separate respective substrates 73. They may be rigidly attached together, for example by bonding first surface of second array 72 to second surface of first array 71 at contact points (or lines) using suitable adhesive. Alternatively, first and second arrays 71 and 72 may be rigidly attached together, to support the lenses in the appropriate series configuration. Thus, the lenses may be manufactured, then glued together.

In FIG. 7, the curved lens surfaces are shown formed on first surfaces of substrates 73. It will be appreciated that in alternative embodiments the curved lens surfaces may be formed on second surface, for one or both arrays 71 and/or 72. Also, although the lenses in FIG. 7 have the same pitch, in alternative embodiments the pitches may differ.

Figure 10:
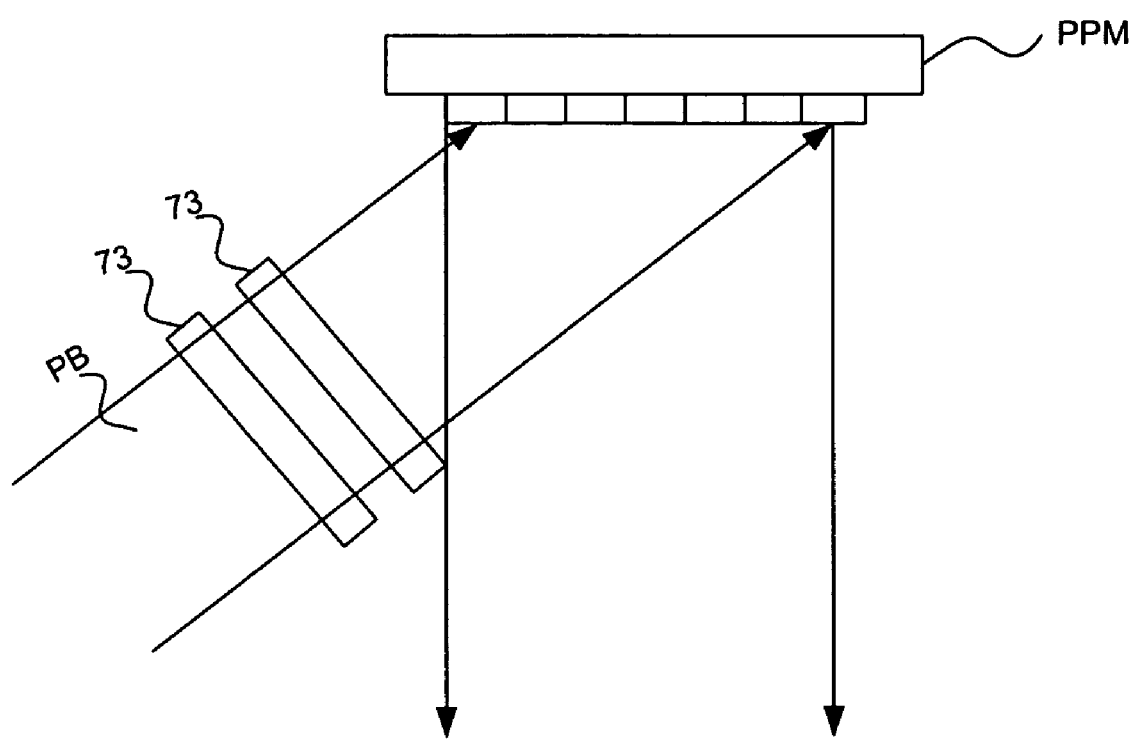
FIGS. 10 and 11 show various configurations of lenslet arrays between a radiation source and a patterning device.
Figure 11:
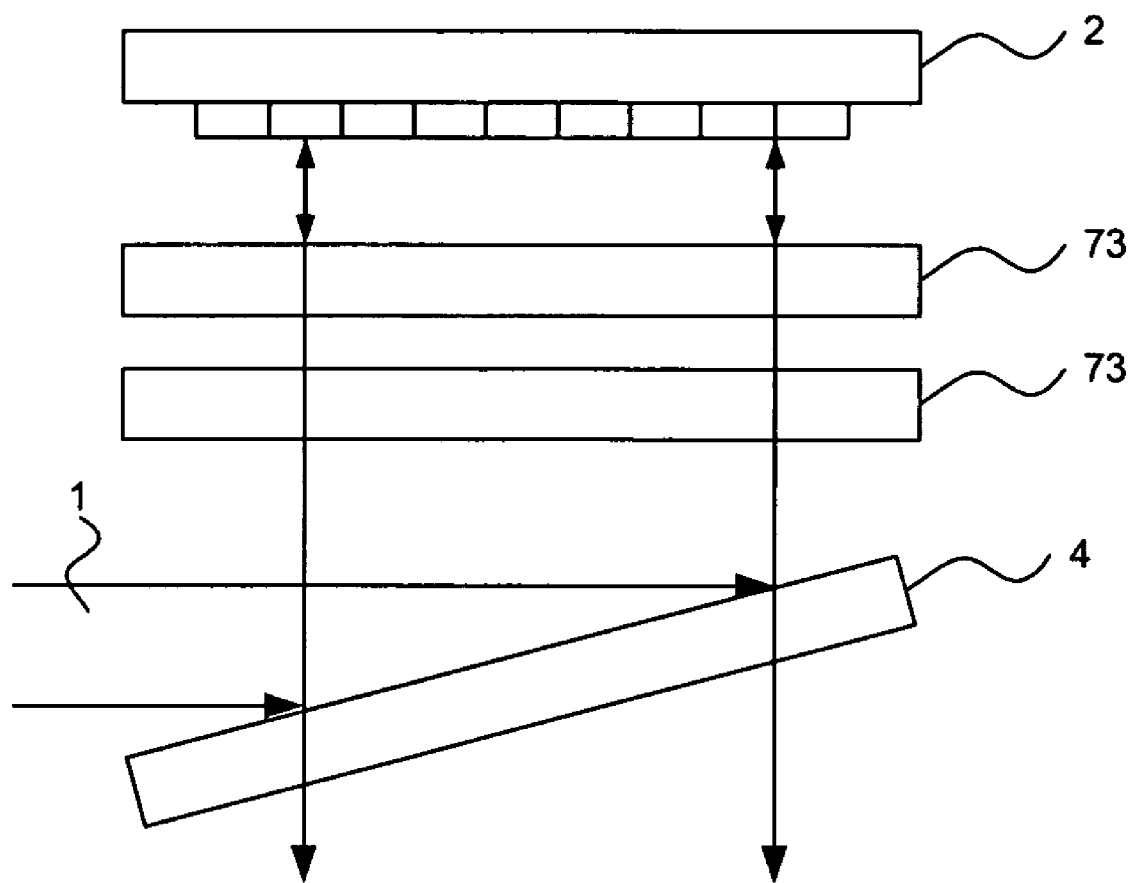

It will be appreciated that array of lenses shown in FIG. 7 is particularly suited for projecting a beam patterned by a rectangular array of controllable elements, such that each projected radiation spot 12 corresponds to a respective one of the controllable elements. It will also be appreciated that a lens array of the type shown in FIG. 7 may also be used in an illuminator of apparatus, such as that shown in FIG. 1, to divide the radiation beam provided from the source into a plurality of rectangular portions, and focus each rectangular portion onto a respective one of the controllable elements in the rectangular patterning array, such as is shown in FIGS. 10 and 11.

Figure 8:
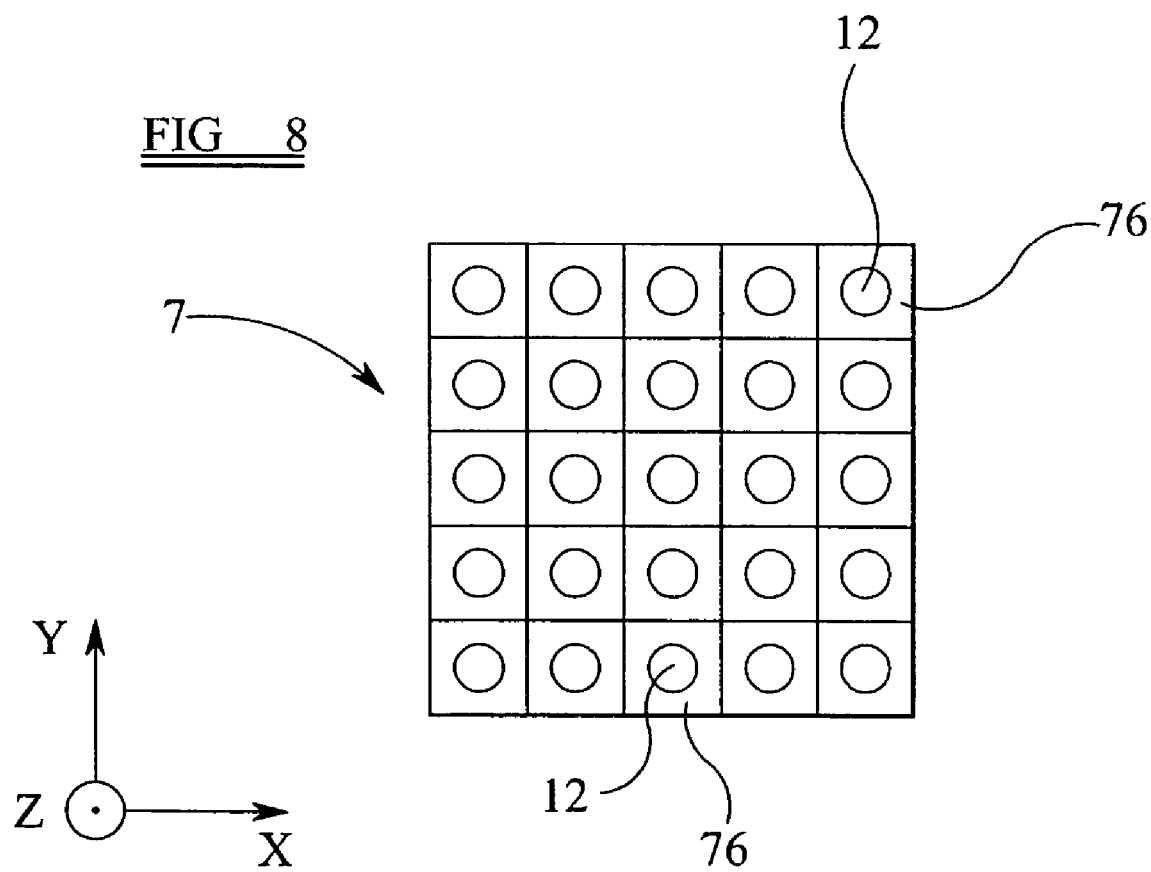
FIG. 8 is a schematic representation of a lens array and also depicts the corresponding array of projected radiation spots, according to one embodiment of the invention.

FIG. 8 is a schematic representation of a lens array and also depicts the corresponding array of projected radiation spots, according to one embodiment of the invention. This shows a plan view of a simplified lens array 7. Lens array 7 represents a 2D lens array formed by two crossed cylindrical lens arrays. Array of lenses 7 comprises a plurality of lenses, each of which is arranged to receive and focus an incident rectangular portion of a patterned beam. Each lens 76 of lens array 7 has a square aperture. Each lens 76 may be provided by a single lens component or a series of lens components along a beam direction. Lenses 76 are arranged to provide a high fill ratio, which may be 98% or more. This figure corresponds to the proportion of the incident beam cross section that is focused onto the target substrate.

Figure 9:
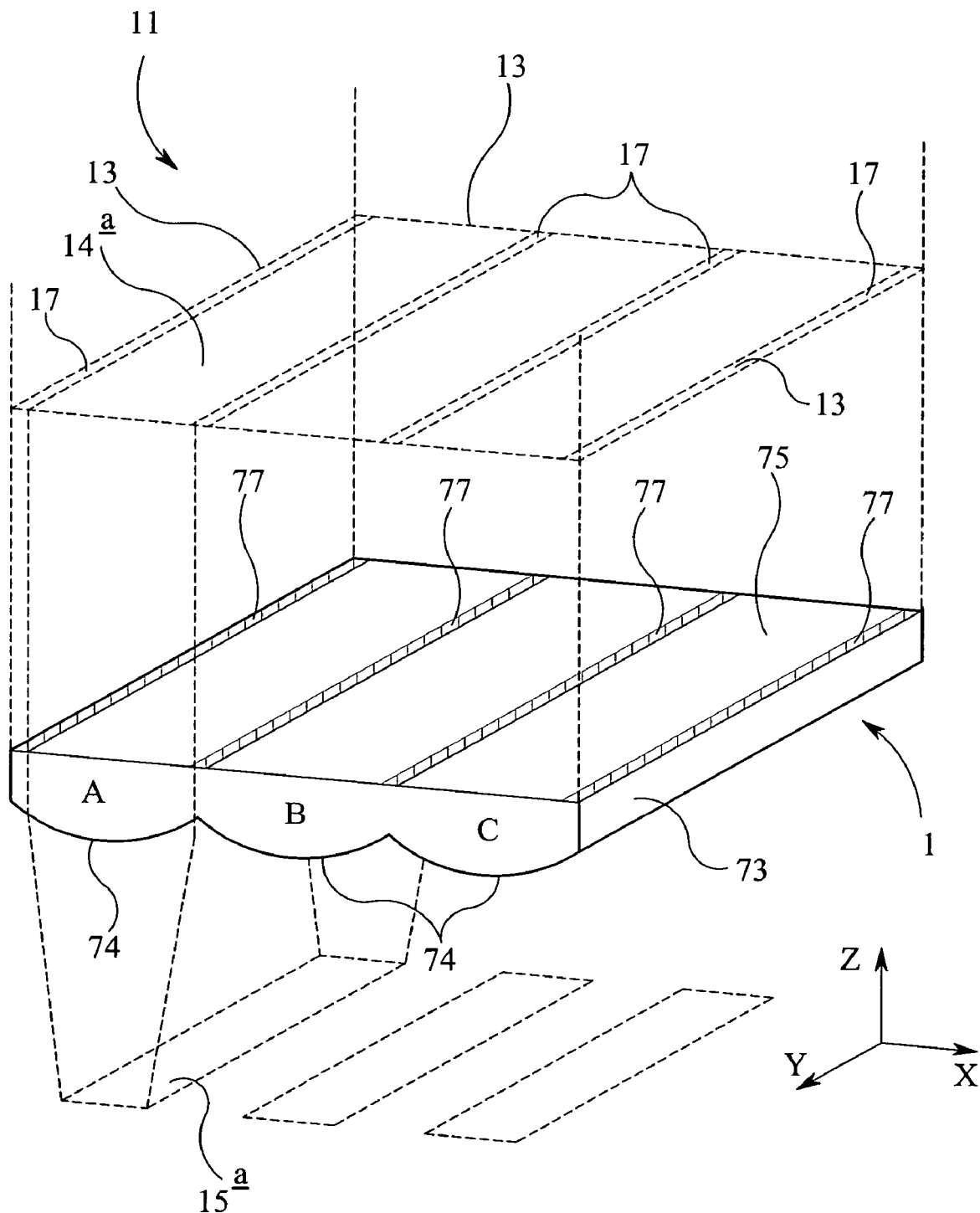
FIG. 9 is a schematic representation of a lens array, according to one embodiment of the invention.

FIG. 9 is a schematic representation of a lens array, according to one embodiment of the invention. A cylindrical lens array 71 comprises a transparent substrate 73 having a substantially flat upper surface 75 and a lower surface that comprises cylindrical portions 74 arranged to define an array of three parallel cylindrical lenses. In this embodiment, a masking structure in the form of lines 77 of radiation blocking material is formed on first surface 75. In certain applications this provision of a masking structure may be desirable to prevent cross talk. Even with the masking structure, however, array of lenses 71 is arranged to focus 95% of an incident beam 11. Each cylindrical lens focuses a respective rectangular portion 14 of a patterned beam cross section 13. For example, cylindrical lens A receives and focuses portion 14a, and can thus deliver a focused rectangle of radiation 15a to some other component (e.g., a "crossed" second array of cylindrical lenses) or to a target surface. The masking structure 77 of the array 71 blocks a portion 17 of incident beam 11.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above described exemplary embodiments, but should be defined only in accordance with the following claims and their equivalents.

What is claimed is:

1. A lithographic apparatus, comprising:
   an illumination system that supplies a beam of radiation;
   an array of individually controllable elements that pattern the beam; and
   a projection system that projects the patterned beam onto a target portion of a substrate, the projection system includes an array of lenses including,
     a first parallel array of cylindrical lenses, which extend across the patterned beam in a first direction, and
     a second parallel array of cylindrical lenses, which receive at respective lenses respective portions of the patterned beam from the first parallel array of cylindrical lenses and which extend across the patterned beam in a second direction, the second direction being substantially perpendicular to the first direction, and project the patterned beam onto the target portion of the substrate,
   wherein the array of lenses receive the patterned beam, divide the patterned beam into a plurality of substantially polygonal portions, and focus each substantially polygonal portion to form a respective beam spot on the target portion of the substrate.

2. The apparatus of claim 1, wherein the polygonal portions are substantially rectangular.

3. The apparatus of claim 2, wherein the polygonal portions are substantially square.

4. The apparatus of claim 1, wherein the first array of cylindrical lenses receive a respective portion of the patterned beam and focus the respective portion towards respective focal lines, the focal lines being substantially parallel to each other and to a first axis that is transverse to a beam direction.

5. The apparatus of claim 4, wherein the focal lines are coplanar.

6. The apparatus of claim 4, wherein the second array of cylindrical lenses receive the focused, patterned beam from the first array, the cylindrical lenses of the second array receive the respective portion of the focused, patterned beam and direct the respective portion towards second respective focal lines, the second focal lines being substantially parallel to each other and to a second axis that is transverse to the beam direction and substantially perpendicular to the first axis.

7. The apparatus of claim 6, wherein the second focal lines of are coplanar.

8. The apparatus of claim 1, wherein:
   the cylindrical lenses of the first array have a first common focal length;
   the cylindrical lenses of the second array have a second common focal length; and
   the first common focal length is longer than the second common focal length.

9. The apparatus of claim 6, wherein the first and second cylindrical lens arrays are arranged such that the first and second focal lines lie in a same plane.

10. The apparatus of claim 1, wherein:
    the second array of cylindrical lenses comprises a transparent substrate; and
    the cylindrical lenses of the second array are formed by respective portions of the substrate.

11. The apparatus of claim 1, wherein:
    the first array of cylindrical lenses comprises a first transparent substrate;
    the cylindrical lenses of the first array are formed by respective portions of the first substrate;
    the second array of cylindrical lenses comprises a second transparent substrate;
    the cylindrical lenses of the second array are formed by respective portions of the second substrate; and
    the second substrate is attached to the first substrate.

12. The apparatus of claim 1, wherein;
    the array of lenses comprises a transparent substrate; and
    the cylindrical lenses of the first and second arrays are formed by respective portions of the substrate.

13. The apparatus of claim 1, wherein:
    the first array of cylindrical lenses comprises a transparent substrate; and
    the cylindrical lenses of the first array are formed by a respective portion of the substrate.

14. The apparatus of claim 1, wherein the projection system further comprises an aperture array that blocks a portion of the patterned beam.

15. The apparatus of claim 1, wherein the array of lenses focuses at least 90% of the patterned beam onto the target portion of the substrate.

16. The apparatus of claim 1, wherein:
the array of individually controllable elements is a rectangular array; and
the array of lenses is arranged such that the projected spots form a rectangular array, each spot corresponding to a respective one of the controllable elements.

17. A lithographic apparatus, comprising:
an illuminator that receives a beam of radiation from a radiation source;
an array of lenses that includes,
    a first parallel array of cylindrical lenses, which extend across the patterned beam in a first direction, and
    a second parallel array of cylindrical lenses, which extend across the patterned beam in a second direction, the second direction being substantially perpendicular to the first direction,
wherein the array of lenses is configured to receive the beam from the illuminator, divide the beam into a plurality of substantially polygonal portions, and focus each substantially polygonal portion onto a respective one of an array of individually controllable elements to pattern the polygonal portions; and
a projection system that projects the patterned beams onto a target portion of a substrate.

18. A device manufacturing method, comprising:
(a) patterning a beam of radiation with an array of individually controllable elements;
(b) using a first parallel array of cylindrical lenses, which extend across the patterned beam in a first direction, to divide the patterned beam into a plurality of substantially polygonal portions; and
(c) using a second parallel array of cylindrical lenses, which receive at respective lenses respective portions of the patterned beam from the first parallel array of cylindrical lenses and which extend across the patterned beam in a second direction, the second direction being substantially perpendicular to the first direction, to focus the substantially polygonal portions to form respective beam spots on the target portion of the substrate.

19. A device manufacturing method comprising the steps of:
(a) using a first parallel array of cylindrical lenses, which extend across the patterned beam in a first direction, to divide a beam received from a radiation source into a plurality of substantially polygonal portions;
(b) using a second parallel array of cylindrical lenses, which extend across the patterned beam in a second direction, the second direction being substantially perpendicular to the first direction, to focus the substantially polygonal portions onto respective individually controllable element in an array of individually controllable elements;
(c) patterning the focused beams with the respective individually controllable elements in the array of individually controllable elements; and
(d) projecting the patterned beam onto a target portion of a substrate.

* * * * *